United States Patent [19]

Gyles

[11] Patent Number: 4,654,584
[45] Date of Patent: Mar. 31, 1987

[54] HIGH-SPEED PRECISION EQUIVALENT TIME SAMPLING A/D CONVERTER AND METHOD

[75] Inventor: Colin Gyles, Boxford, Mass.

[73] Assignee: Analogic Corporation, Peabody, Mass.

[21] Appl. No.: 808,454

[22] Filed: Dec. 12, 1985

[51] Int. Cl.[4] ............................................. G01R 19/00
[52] U.S. Cl. .................................. 324/76 R; 364/484; 364/487
[58] Field of Search ................ 324/76 R, 77 R, 77 A, 324/78 R, 78 D, 78 E, 78 F, 79 R, 79 D, 82, 112, 83 R, 83 D, 102, 121 R; 328/151; 340/347 SH; 364/484, 486, 487, 574

[56] References Cited

U.S. PATENT DOCUMENTS

| | | | |
|---|---|---|---|
| 3,456,189 | 7/1969 | Hornak | 324/121 R |
| 3,484,591 | 12/1969 | Trimble | 364/574 |
| 3,662,380 | 5/1972 | Cargile | 324/112 |
| 4,047,115 | 9/1977 | Toda et al. | 328/151 |
| 4,225,940 | 9/1980 | Moriyasu et al. | 324/121 R |
| 4,283,713 | 8/1981 | Philipp | 324/102 |
| 4,345,241 | 8/1982 | Takeuchi | 340/347 SH |
| 4,353,057 | 10/1982 | Bernet et al. | 324/102 |
| 4,362,394 | 12/1982 | Menlove | 324/77 A |
| 4,507,740 | 3/1985 | Star et al. | 324/77 R |

*Primary Examiner*—Michael J. Tokar
*Attorney, Agent, or Firm*—Joseph S. Iandiorio

[57] ABSTRACT

A circuit for precisely measuring very high-speed recurring waveforms includes a comparator coupled between an analog input terminal and a successive approximation register. A digital-to-analog converter is also coupled between the digital output circuit of the successive approximation register and the second input terminal of the comparator, and a high-speed digital latch is coupled between the output of the comparator and the input of the successive approximation register for freezing the output states of the comparator upon the application of hold signals from a hold signal generator means, so that a first sequential series of hold signals are applied to the latch, coincident in time with the occurrence of a first portion of the recurring analog waveforms being measured, until the successive approximation register completes its measurement of the voltage amplitude of such first portion. A counter in the hold signal generator means is thereafter stepped, to enable the measurement of a second portion of the recurring waveform, adjacent the first portion, to be carried out by the application of a second series of hold signals, each coincident in time with the occurrence of the second portion of the waveform, until the voltage amplitude at the second portion is evaluated by the iterative operation of the successive approximation register. The counter is again stepped, and the process is repeated until numerous points upon the recurring waveform under examination are measured.

14 Claims, 3 Drawing Figures

HIGH-SPEED PRECISION EQUIVALENT TIME SAMPLING A/D CONVERTER AND METHOD

BACKGROUND OF THE INVENTION

The present invention relates to waveform measurement systems and to the field of analog-to-digital converters.

A number of various types of analog-to-digital converters are known to those skilled in the art including integration A/D circuits, parallel A/D circuits, binary ramp A/D circuits and successive approximation A/D circuits.

It is a primary object of the present invention to provide a new method and apparatus for measuring extremely high-speed analog signals with high precision, and converting them into digital or analog form at a slower rate, such signals having rise times of less than two nano-seconds, with an accuracy of 0.01% of full scale.

In waveform digitizing systems the input analog signal is converted into digital form so that the waveform may be processed by digital circuitry. Such waveform acquisition is typically achieved by the use of an analog-to-digital converter sampling instanteneous values of the input signal at predetermined points along the waveform. Acquisition techniques known to those skilled in the art includes real-time acquisition, wherein all the waveform points are acquired in a single sweep, and equivalent time acquisition whereby all of the points are acquired, one point per sweep, during successive sweeps. Such equivalent time acquisition is used for higher sweep rates for high-speed acquisition, rather than real-time acquisition.

Successive approximation A/D converters are also known which employ trial and error to measure the analog signal. In accordance with this technique a successive approximation register makes a trial conversion, tests the results, and then modifies its output according to the results of the test. The trials continue until the available bits are exhausted and the conversion is finished. In other words, in accordance with this technique, the successive approximation register hunts to set the output of a D/A converter to match the input signal. This is accomplished one bit at a time, starting with the most significant bit, each time the approximation register is clocked. Upon completion of this process, a data strobe is outputted indicating that the digital data in the register represents the true value of the analog input signal. This process is slow, limited primarily by the speed of the D/A converter, and the number of bits in the digital word. Additionally the input signal must remain constant over the trial and error period.

An equivalent time sampler requires a signal that repeats, at least for the time interval of interest, after a recurring trigger event. While this technique is relatively fast, the voltage measurement accuracy is limited by the design of a track-and-hold-circuit, requiring the use of non-linear switching elements. When the input signals have extremely high frequencies, the storage capacitor of the track-and-hold circuit is very small since it must charge and discharge extremely rapidly. As a result, the leakage of a small charge quantity produces inaccuracies during the conversion process.

To the inventor's knowledge, the precision measurement (0.01% of full scale) of extremely high frequency signals having rise times of less than two nano-seconds, has not been achieved in the field, prior to his invention. Furthermore the inventor was told by persons skilled in the art that it couldn't be done by presently available test instrumentation.

SUMMARY OF THE INVENTION

In accordance with a preferred embodiment of the invention, a comparator is coupled between an analog input terminal and a successive approximation register. A digital-to-analog converter is also coupled between the digital output circuit of the successive approximation register and the second input terminal of the comparator, and a high-speed digital latch is coupled between the output of the comparator and the input of the successive approximation register for freezing the output states of the comparator upon the application of hold signals from a hold signal generator means, so that a first sequential series of hold signals are applied to the latch, coincident in time with the occurrence of a first portion of the recurring analog waveforms being measured, until the successive approximation register completes its measurement of the voltage amplitude of such first portion. A counter in the hold signal generator means is thereafter stepped, to enable the measurement of a second portion of the recurring waveform, adjacent the first portion, to be carried out by the application of a second series of hold signals, each coincident in time with the occurrence of the second portion of the waveform, until the voltage amplitude at the second portion is evaluated by the iterative operation of the successive approximation register. The counter is again stepped, and the process is repeated until numerous points upon the recurring waveform under examination are measured.

DISCLOSURE OF PREFERRED EMBODIMENT

Other objects, features, and advantages of the present invention will become apparent upon study of the following specific description taken in conjunction with the drawings in which.

Figure 1:
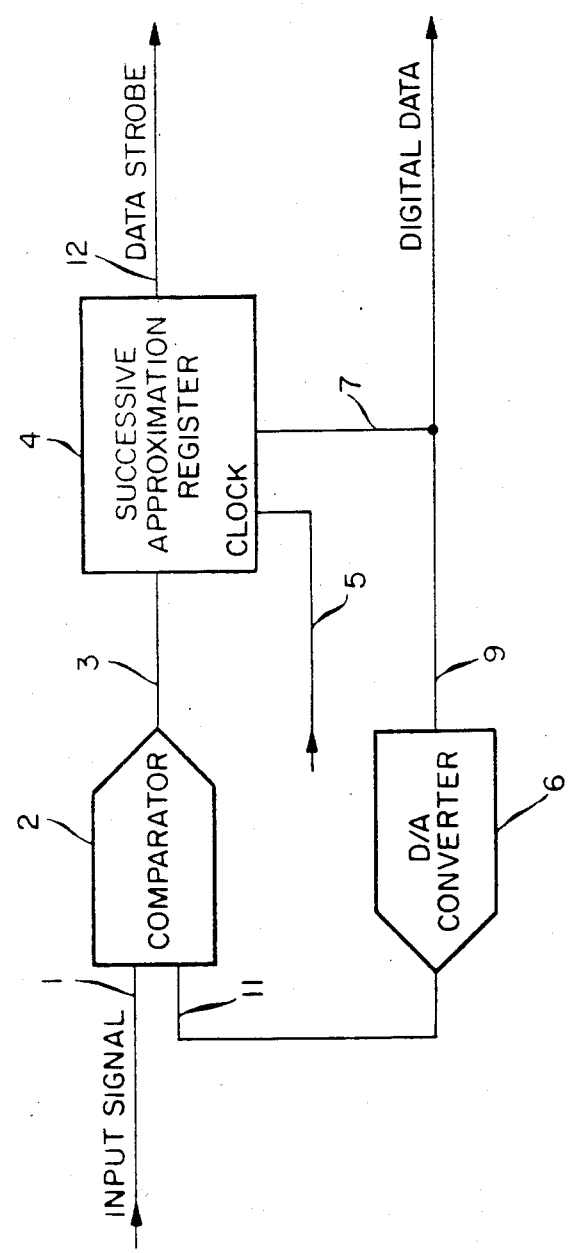
FIG. 1 illustrates analog-to-digital conversion employing successive approximation known in the prior art.
Figure 2:
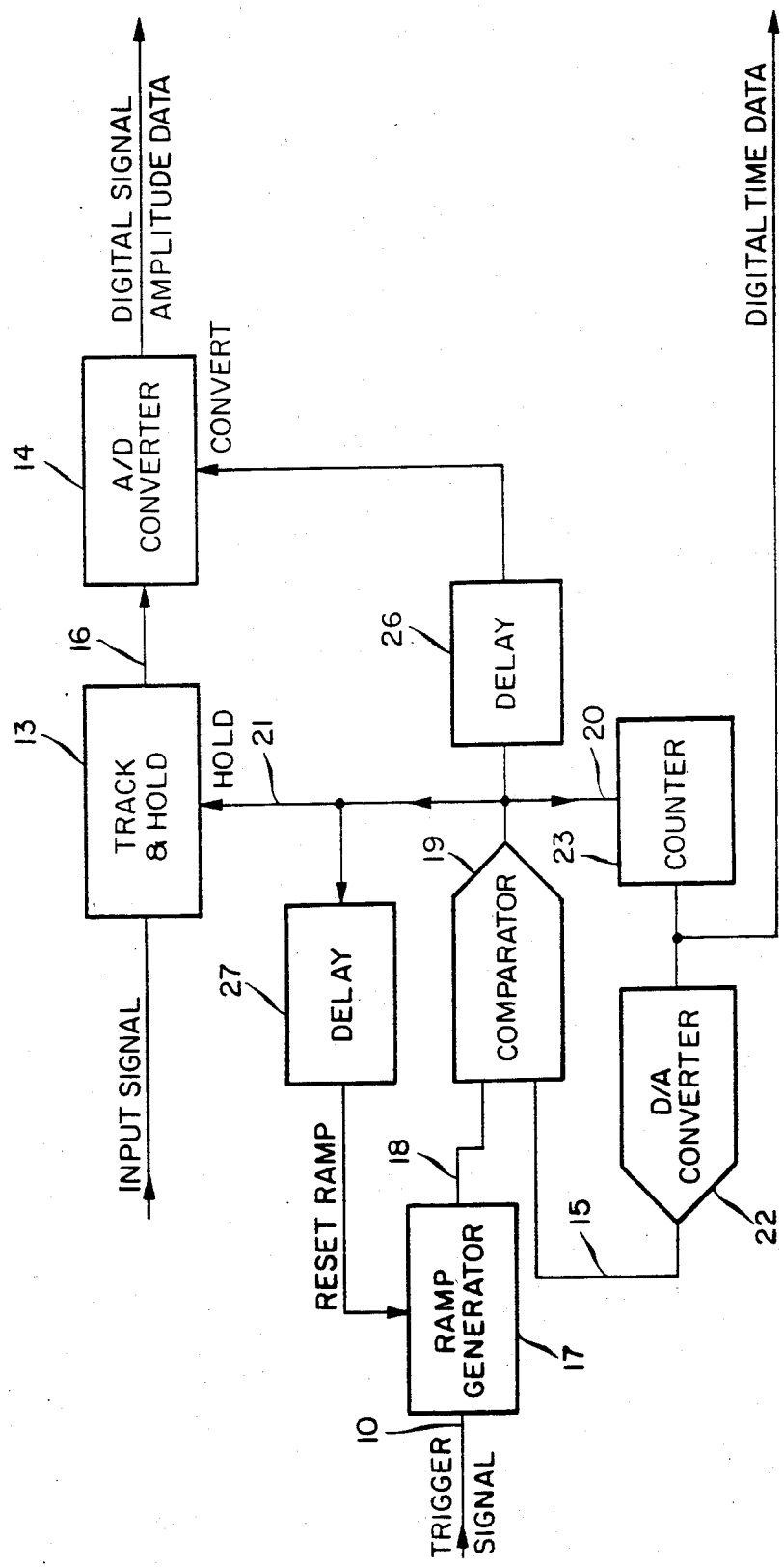
FIG. 2 illustrates a prior art equivalent time sampler.

It is believed that the invention will be best understood after considering the prior art circuits of FIGS. 1 and 2. The term waveform portion or point used herein means that voltage existing at particular times after the trigger event, to be described. In FIG. 1, the analog signal to be measured is applied to a first input terminal 1 of comparator 2, the output thereof being connected to the input circuit 3 of successive approximation register 4, the digital output thereof in turn being applied in parallel to digital-to-analog converter 6, via bus 7 and 9 as shown. The output circuit of D/A converter 6 is applied to the second input terminal 11 of comparator 2. Upon the application of the first clock pulse upon lead 5, the first most significant bit is temporarily set high, and the rest are low, creating a digital output of typically half scale. If the input signal 1 is greater than this voltage, the output register latch is set to high. On the other hand, if the input voltage is less than this value, the first bit latch is reset low. Register 4 thereafter shifts one bit to the right, and a second trial is undertaken with a less significant bit. The output of comparator 2 produces the test results, to cause the stages of the register to assume binary 1 or binary 0 states. After the final bit has been tested e.g. the sixteenth bit, a data strobe signal is produced on lead 12 to enable the digital word on bus 7 to be outputted, since only this digital word is a valid measurement of the input signal.

The equivalent time sampler of FIG. 2 requires a signal that repeats, at least for the time interval of interest, after a recurring trigger event, such signal being applied to the input circuit of track-and-hold circuit 13, the output thereof in turn being coupled to A/D converter 14 via lead 16. A trigger signal is applied to the input circuit 10 of ramp generator 17 to initiate its operation. A first input terminal 18 of comparator 19 is coupled to the output of the ramp generator, the output thereof being coupled to a hold terminal 21 of track and hold circuit 13. The second input terminal of comparator 19 is coupled to the output cirucit 15 of D/A converter 22, which converts the digital contents of counter 23 to an analog signal. Thus the time delay from the trigger signal to the hold signal is a function of the slope of the voltage ramp and the counter output value representing the digital time data. Track-and-hold signal 13 continuously samples the analog input signal to be measured, and an output from comparator 19, applied to hold terminal 21, "freezes" the instantaneous analog value stored within the track-and-hold circuit. This value is converted into a digital signal by A/D converter 14. The hold signal passes through delay 26 to readout the A/D converter 14 after it settles, and also passes through delay 27 to cause the ramp generator 17 to be reset, and counter 23 is stepped. In other words, the frozen output of circuit 13 is fed to a slow A/D converter 14 to produce a digital representation of the voltage existing at the instant of time represented by the digital time data, which is also the value stored in counter 23, and the ramp generator is reset to allow the process to repeat for a slightly longer delay time. The increase in the delay time is produced by incrementing counter 23 by one due to the application of the hold signal to the counter via lead 20. During the second pass, it will take slightly longer for the ramp generator output to equal the slightly increased analog signal produced by D/A converter 22, due to the stepping of the counter. The resulting second hold signal applied at a slightly longer delay from the trigger signal time, will produce the second measured digital value slightly shifted in time with respect to the trigger, and the process continues so that for each incrementing of counter 23, a displaced point on the wavefront is measured amplitudewise, and a digital output indicative of the measurement is generated by A/D converter 14. If the counter is initially set to 0, and allowed to increment to its maximum, the digital signal amplitude data and the associated digital time data or counter value, can be used by a computer or other circuit, to reconstruct the input signal waveform.

As mentioned previously, the voltage measurement accuracy of this technique is limited by the design of the track-and-hold circuit 13, requiring the use of non-linear switching elements and a small capacitor and charge, which create measurement inaccuracies.

Figure 3:
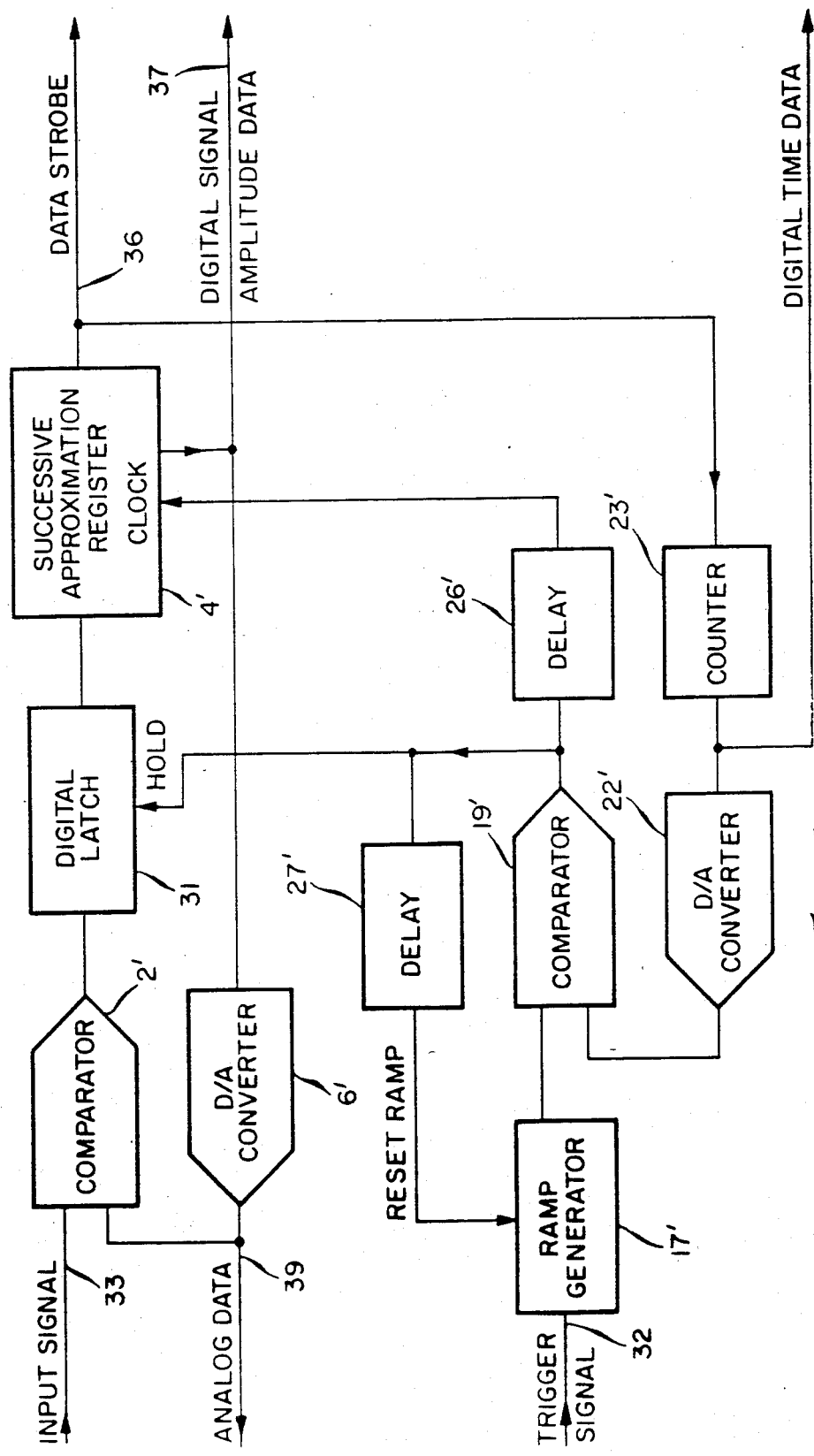
FIG. 3 illustrates a preferred embodiment of the present invention.

Referring now to the presently preferred embodiment (best mode) of the invention illustrated in FIG. 3, a high-speed digital latch circuit 31 is coupled between the output of comparator 2' and the input circuit of the successive approximation register 4' as shown. Preferably latch 31 is unitary with comparator 2', both being positioned within a probe, the tip thereof being applied to the input signal being measured at 33. By building the comparator in the probe, the input may be taken to the required measurement point, with a minimum of stray inductance and capacitance, in order to minimize high-speed distortion. On the other hand, these components may be separated from each other and need not be positioned within a probe.

The sequential trial of the bit positions within register 4' is accomplished as described above, whereby comparator 2' produces outputs indicating the results of each trial sequentially carried out during a measurement of the voltage of a single analog point or portion of the waveform. For example, if sixteen bits are employed in register 4', comparator 2' produces 16 binary states which are sequentially applied to latch 31. Also the hold signal produced by compartor 19', is generated after a delay from the trigger signal, such delay being a function of the counter output defining the digital time base. The rising edge of the hold signal latches the state of the comparator 2' output, and then, after a delay due to delay means 26', clocks one iteration of the successive approximation register to set the stage for the next trial. The hold signal also passes through delay 27' to reset the ramp generator so that the ramp generator is reset during each sample taken from the output of comparator 2' indicating the result of each trial. Starting with the most significant bit in our example, sixteen successive trials are carried out before the final valid digital word is produced at the output of register 4'. At the end of each trial, the ramp generator 17' is reset to enable the next trial to be carried out at the same delay time as the previous delay time. In other words, during the sixteen iterations of the register 4' controlled by sixteen sequential outputs of latch 31, the ramp is reset sixteen times, but the value in counter 23' remains constant so that in effect the voltage associated with one particular point or portion of the waveform is examined sixteen times by latch 31 at a fixed time delay after the instant of trigger 32, that initiates the operation of ramp generator 17'. After the approximation is completed, a data strobe signal is generated upon lead 36, to output the parallel digital word upon bus 37, since such a binary word now represents the valid completed measurement of the analog input signal at the input circuit of comparator 2'. The analog output of converter 6' may also be utilized by a device coupled to terminal 39, if desired. The data strobe signal is also applied to the input circuit of counter 23' to increase its count, so that the system will now evaluate the voltage associated with a second adjacent point on the waveform since the delay of the equivalent time sampler has been slightly increased owing to the incrementing of the count in counter 23'. The delay of 27' is sufficient to permit the D/A converter 6' supplying the analog data to comparator 2' to settle, before the ramp generator is re-enabled.

Thus the circuitry at the lower portion of FIG. 3 may be characterized as a hold signal generator means for applying a first sequential series of hold signals to the latch means during a first series of examination intervals, each hold signal being coincident in time with the occurrence of a first point upon, or first portion of, the recurring analog signals being measured, until the register 4' completes its measurement of the amplitude of the first waveform portion after the series of sixteen iterations each representing a partial measurement. Owing to delay 27', the hold signals are separated from each other for a time equal to or greater than the settling time of converter 6'. The count in the counter is now increased by the strobe upon digital readout of register 4', and a second series of hold signals are thereafter applied to the latch during a second series of examination intervals, each signal being coincident in time with the occurrence of a second portion of the waveform, adjacent the first portion, until the second group of sixteen iterations have been completed, and so on, until all of the desired points upon the repetitive waveform have been measured and outputted.

The production of the trigger event signal applied at 32 to the input circuit of ramp generator 17' could be, for example, coincident with the 0 crossover point of an AC pulse train (the recurring analog waveforms) being measured at 33. Thus each trigger event is correlated in time with a particular portion of the recurring waveform. The pulses of the pulse train could possibly have a sufficiently low repetition rate so that each crossover trigger event could initiate the operation of ramp generator 17' to define the delay, and hence the point on the wavefront under examination. Usually the pulses will have higher frequencies, so that most trigger signals would be ineffective with respect to restarting ramp generator 17', since it would have an insufficient time to reset. Thus it should be understood that the waveform portion under examination could have an extremely small pulse width and yet such waveform would be very precisely measured *regardless of very high repetition frequencies of the pulses being measured.* Voltage accuracy is obtained through the use of any high precision D/A converter 6' to produce the analog data signal used by comparator 2' and the *speed of this device is not critical.* Comparators with built in latches may be obtained that are very fast, and the comparator input is simple, in contrast with a track-and-hold circuit 13 described in FIG. 2.

It should be understood that the above described embodiment of the invention is merely exemplary and that other sub-circuits may be utilized in the practice of the present invention, and thus the scope of the invention is to be limited only by the language of the following claims and and equivalents thereof. For example the digital time base could be produced by a random number generator rather than a stepped counter.

Although specific features of the invention are shown in some drawings and not others, this is for convenience only as each feature may be combined with any or all of the other features in accordance with the invention.

Other embodiments will occur to those skilled in the art and are within the following claims.

What is claimed is:

1. A circuit for precisely measuring high speed analog input signals that repeat during time periods under examination comprising:
   successive approximation register means having an input and output circuit;
   comparator means having an output circuit, a first input circuit for receiving said high-speed analog signals and a second input circuit;
   a digital-to-analog converter means, coupled between the digital output circuit of said successive approximation register means and the second input circuit of said comparator and having a given settling time;
   high-speed latch means coupled between the output circuit of said comparator and the input circuit of said successive approximation register means for freezing the output state of said comparator upon the application of a hold signal to the hold terminal of said latch means; and
   hold signal generator means for
   (a) applying a first sequential series of hold signals to the hold terminal of said latch means, each being coincident in time with the occurrence of a first portion of said analog signals, until said successive approximation register means completes its measurement of the amplitude of said first portion, said hold signals being separated from each other for a time equal to or greater than the settling time of said converter;
   (b) thereafter applying a second sequential series of hold signals to the hold terminal of said latch means, each being coincident in time with the occurrence of a second portion of said signals different from said first portion, until said successive approximation register means completes its measurement of the amplitude of said second portion, said hold signals being separated from each other for a time equal to or greater than the settling time of said converter, and so on until all desired portions of said analog signals are measured.

2. The combination as set forth in claim 1 including means for operating said hold signal generator means in response to repetitive trigger events associated with particular portions of said high-speed analog signals.

3. The combination as set forth in claim 2 wherein said hold signal generator means comprises an equivalent time sampler without a track-and-hold circuit and analog-to-digital converter, for generating groups of hold signals applied to said latch means, each group of hold signals having delays relative to the times of occurrences of said trigger events differing from the delays of other groups to enable the reconstruction of the waveform of said analog signals.

4. The combination as set forth in claim 3 wherein said hold signal generator means includes counter means coupled to the output circuit of said successive approximation register means for altering said delays to enable reconstruction of said waveforms, and means for stepping said counter means upon the completion of the measurement of each waveform portion by said successive approximation register means.

5. The combination as set forth in claim 4 including means for reading out the count within said counter to provide digital time data.

6. The combination as set forth in claim 1 wherein said comparator means and said latch means are contained within a test probe for receiving said analog input signals.

7. The combination as set forth in claim 2 wherein said comparator means and said latch means are contained within a test probe for receiving said analog input signals.

8. The combination as set forth in claim 3 wherein said comparator means and said latch means are contained within a test probe for receiving said analog input signals.

9. The combination as set forth in claim 4 wherein said comparator means and said latch means are contained within a test probe for receiving said analog input signals.

10. The combination as set forth in claim 5 wherein said comparator means and said latch means are contained within a test probe for receiving said analog input signals.

11. The combination as set forth in claim 1 including a digital output bus coupled to the output of said successive approximation register.

12. The combination as set forth in claim 1 including an analog data output lead coupled to the output of said digital-to-analog converter means.

13. Method of precisely measuring a single high speed analog input waveform that repeats during time periods under examination, comprising the steps of:

(a) partially measuring the amplitude of a first particular portion of said waveform a plurality of times during a first repetitive series of examination intervals, until an accurate final measurement of the amplitude of said first particular portion is obtained;

(b) repeating step (a) for a number of subsequent repetitive series of examination intervals, while measuring a given particular portion of said waveform during each series of examination intervals, each given particular portion differing from the particular portions examined during other series of examination intervals, thereby to measure said waveform.

14. The method of claim 13 wherein said waveform is measured after given delays following the occurrence of a trigger event, said delays being different for each series of examination intervals, each trigger event being correlated in time with a particular portion of said waveform.

* * * * *